US009841791B2

(12) United States Patent
Mullen et al.

(10) Patent No.: US 9,841,791 B2
(45) Date of Patent: Dec. 12, 2017

(54) CIRCUIT BOARD ASSEMBLY CONFIGURATION

(71) Applicant: Rambus Inc., Sunnyvale, CA (US)

(72) Inventors: Donald R. Mullen, Berkeley, CA (US); Chi-Ming Yeung, Cupertino, CA (US); David A. Secker, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 166 days.

(21) Appl. No.: 14/568,880

(22) Filed: Dec. 12, 2014

(65) Prior Publication Data
US 2015/0181746 A1 Jun. 25, 2015

Related U.S. Application Data

(60) Provisional application No. 62/065,659, filed on Oct. 18, 2014, provisional application No. 61/919,318, filed on Dec. 20, 2013.

(51) Int. Cl.
| | |
|---|---|
| *H05K 1/14* | (2006.01) |
| *G06F 1/18* | (2006.01) |
| *H05K 7/14* | (2006.01) |
| *H05K 7/20* | (2006.01) |

(52) U.S. Cl.
CPC .............. *G06F 1/183* (2013.01); *G06F 1/185* (2013.01); *H05K 7/1487* (2013.01); *H05K 7/20409* (2013.01); *H05K 7/20709* (2013.01); *H05K 1/14* (2013.01)

(58) Field of Classification Search
CPC .. H05K 1/14; H05K 7/1445; H05K 2201/044; H05K 1/141; H05K 7/1487; H05K 7/20409; H05K 7/20709; G06F 1/185; G06F 1/183

See application file for complete search history.

(56) References Cited

U.S. PATENT DOCUMENTS

| | | | |
|---|---|---|---|
| 6,690,584 B2* | 2/2004 | Uzuka ..................... | G06F 1/184 361/778 |
| 6,934,152 B1* | 8/2005 | Barrow ................ | H05K 7/1461 165/80.3 |
| 7,009,848 B2* | 3/2006 | Ruckerbauer ............ | H05K 1/14 361/679.32 |
| 7,035,111 B1 | 4/2006 | Lin et al. | |

(Continued)

OTHER PUBLICATIONS

PCT International Search Report and Written Opinion dated Apr. 20, 2015 in International Application No. PCT/US2014/071981. 12 pages.

(Continued)

*Primary Examiner* — James Wu
(74) *Attorney, Agent, or Firm* — Lowenstein Sandler LLP

(57) ABSTRACT

A rack unit configuration is described that includes a first printed circuit board (PCB) assembly interleaved with a second PCB assembly that is inverted with respect to the first PCB assembly. The configuration of the first PCB assembly and the second PCB assembly allow for increased component and power densities within computing systems, memory systems, etc. The increased density may be achieved while allowing sufficient mechanical clearance to allow easy component replacement and servicing (e.g., and hot pluggability). Power density may also be increased with PCB assemblies including nested and interleaved power modules.

20 Claims, 11 Drawing Sheets

(56) References Cited

U.S. PATENT DOCUMENTS

| | | | |
|---|---|---|---|
| 7,753,688 B1 | 7/2010 | Everson et al. | |
| 2001/0051457 A1* | 12/2001 | MacLaren | H01R 13/64 |
| | | | 439/488 |
| 2005/0213299 A1* | 9/2005 | Hardt | G06F 1/184 |
| | | | 361/679.31 |
| 2006/0256603 A1* | 11/2006 | Foster | G11C 5/04 |
| | | | 365/63 |
| 2007/0139897 A1 | 6/2007 | RaghuRam | |
| 2008/0002370 A1 | 1/2008 | Lau et al. | |
| 2008/0080149 A1 | 4/2008 | Hanna et al. | |
| 2008/0304223 A1 | 12/2008 | Franz et al. | |
| 2009/0034216 A1 | 2/2009 | Petersen et al. | |
| 2011/0007473 A1 | 1/2011 | Franz et al. | |
| 2011/0149499 A1 | 6/2011 | Bandholz et al. | |
| 2012/0020008 A1 | 1/2012 | Dunwoody et al. | |
| 2012/0194992 A1 | 8/2012 | Bandholz et al. | |
| 2012/0218703 A1* | 8/2012 | Cho | G06F 1/183 |
| | | | 361/679.31 |

OTHER PUBLICATIONS

Notification Concerning Transmittal of Copy of International Preliminary Report on Patentability dated Jun. 30, 2016 re: Int'l Appln. No. PCT/US2014/071981. 9 Pages.

\* cited by examiner

CIRCUIT BOARD ASSEMBLY CONFIGURATION

CROSS REFERENCE TO RELATED APPLICATIONS

The present application claims priority to and the benefit of the commonly owned, provisional patent application, U.S. Ser. No. 62/065,659, entitled "PRINTED CIRCUIT BOARD ASSEMBLY CONFIGURATION," with filing date Oct. 18, 2014, which is herein incorporated by reference in its entirety. The present application claims priority to and the benefit of the commonly owned, provisional patent application, U.S. Ser. No. 61/919,318, entitled "HIGH DENSITY RACK-MOUNT MEMORY WITH PROCESSING CAPABILITY," with filing date Dec. 20, 2013, which is herein incorporated by reference in its entirety.

BACKGROUND

Increasingly, information is stored and processed in large data storage systems. At a base level, these data storage systems are configured with multiple processors, each controlling access to corresponding memory. However, the physical dimensions of standard chassis sizes limit the number of components and resources that can fit into a particular chassis unit.

BRIEF DESCRIPTION OF THE DRAWINGS

Further aspects of the present disclosure will become apparent from the following description which is given by way of example only and with reference to the accompanying drawings in which.

DETAILED DESCRIPTION

Reference will now be made in detail to the various embodiments of the present disclosure, examples of which are illustrated in the accompanying drawings. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Embodiments are configured to allow increased component and power densities within computing systems, memory systems, etc. In some embodiments, the component and power densities are increased for rack based computing systems. Embodiments may allow increased density of memory modules and memory controllers. Embodiments are further configured to allow nesting, interleaving, etc., of printed circuit board (PCB) assemblies to increase component densities. The increased density may be achieved while allowing sufficient mechanical clearance to allow easy component replacement and servicing (e.g., and hot pluggability). Power density may also be increased with embodiments including nested and interleaved power modules.

FIGS. 1-11 illustrate example components used by various embodiments. Although specific components are disclosed in FIGS. 1-11, it should be appreciated that such components are exemplary. That is, embodiments are well suited to having various other components or variations of the components recited in FIGS. 1-11. It is appreciated that the components in FIGS. 1-11 may operate with other components than those presented, and that not all of the components of FIGS. 1-11 are required to achieve the goals of embodiments.

Figure 1:
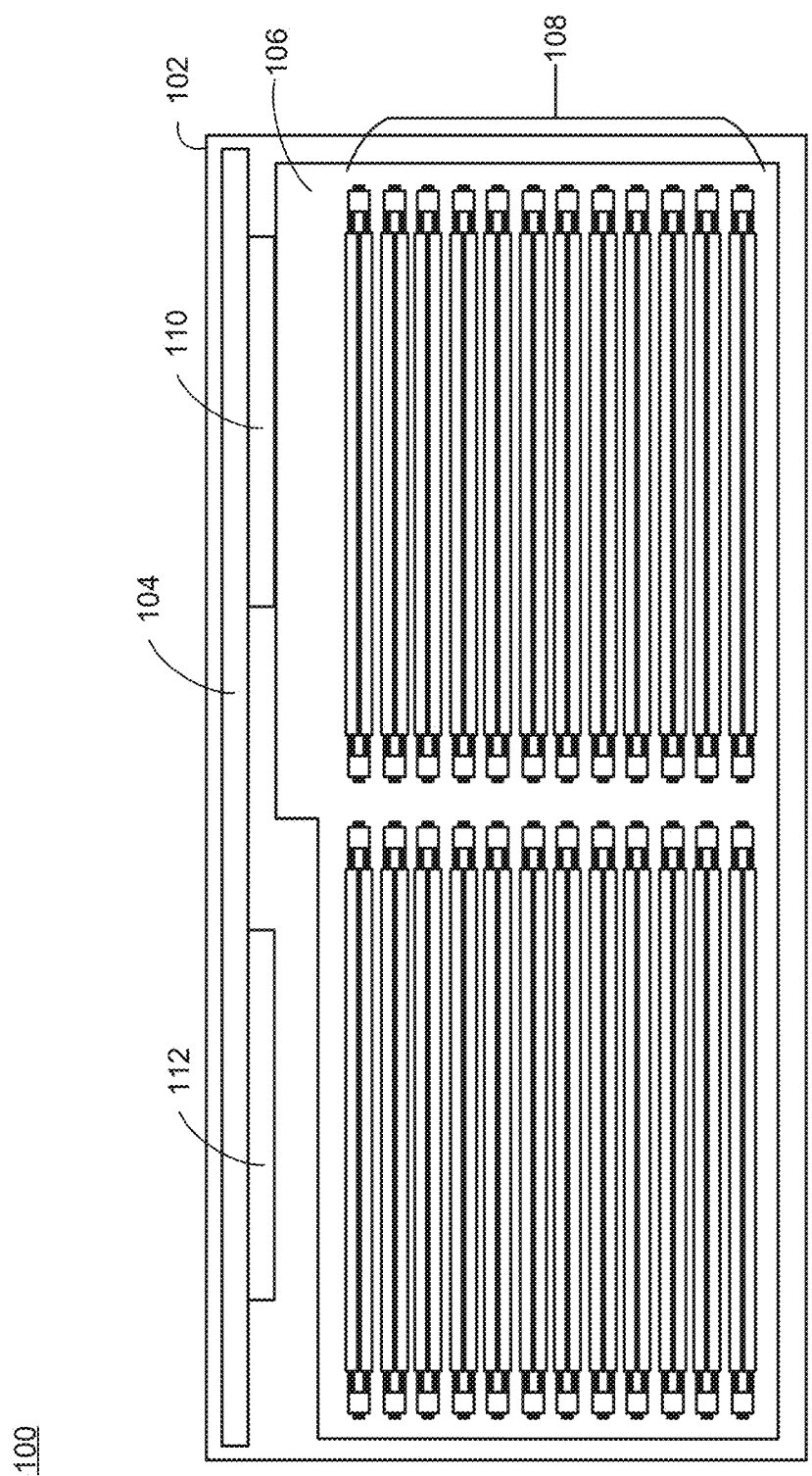
FIG. 1 shows a top view of a printed circuit board (PCB) rack unit configuration, in accordance with various embodiments.

FIG. 1 shows a top view of a printed circuit board (PCB) rack unit configuration, in accordance with various embodiments. FIG. 1 depicts a system 100 with a PCB rack unit configuration within a chassis 102. The chassis 102 may be part of a rack based computing system. For example, a rack may be 42 units height (e.g., approximately 73.5 inches high). The chassis 102 includes a motherboard or backplane 104 and includes one or more printed circuit board assemblies, such as a printed circuit board assembly 106. The backplane 104 includes sockets 110-112 which are operable for coupling to a printed circuit board assembly (e.g., the printed circuit board assembly 106). In some embodiments, the socket 112 is inverted with respect to the socket 110. The printed circuit board assembly 106 includes an interface (not shown) (e.g., within the socket 110) which is configured for communicatively, electrically, etc., coupling the printed circuit board assembly 106 to the backplane 104. In some embodiments, the printed circuit board assembly 106 is hot pluggable to the backplane 104. In some embodiments, the PCB assembly 106 may be coupled to the backplane 104 via one or more cables. The PCB assembly 106 can be part of a memory appliance in one implementation.

In some embodiments, the printed circuit board 106 includes memory slots 108. The memory slots 108 may be configured for coupling memory modules to the printed circuit board assembly 106 and coupling the memory modules to the backplane 104. In some embodiments, a top side of the PCB assembly 106 is configured for coupling of 24 or more memory modules (e.g., DIMMs). Of course, embodiments may support other devices including, but not limited to, volatile memory (e.g., dynamic random access memory or "DRAM"), non-volatile (e.g., flash, solid state disk drives, magnetic, hard drives, etc.) or other types of computer hardware.

Figure 2:
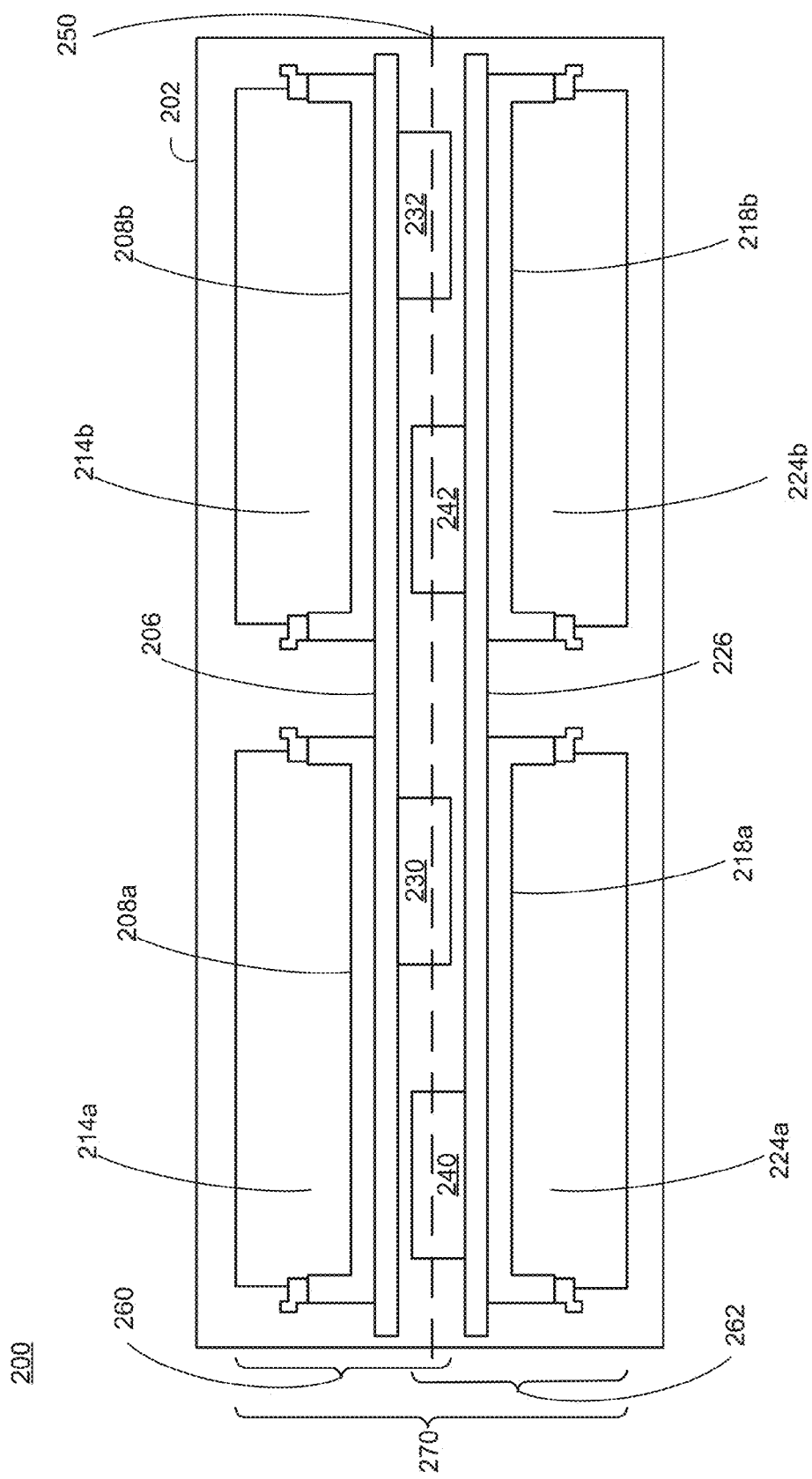
FIG. 2 shows side view of a PCB rack unit configuration, in accordance with various embodiments.

FIG. 2 shows side view of a PCB rack unit configuration, in accordance with various embodiments. FIG. 2 depicts a system 200 with a PCB rack unit configuration from the side including nested and interleaved components. The system 200 includes chassis 202 which includes a printed circuit board assembly 206 and a printed circuit board assembly 226. The printed circuit board assembly 206 includes memory slots 208a-b and components 230-232. The memory slots 208a-b may have memory modules 214a-b coupled thereto. The printed circuit board assembly 226 includes memory slots 228a-b and components 240-242. The memory slots 218a-b may have memory modules 224a-b coupled thereto.

The memory slots 208a-b and memory slots 218a-b can be configured for coupling memory modules to the PCB assembly 206 and the PCB assembly 226, respectively, thereby coupling the memory modules to the backplane 104. The printed circuit board assembly 226 is inverted with respect to the printed circuit board assembly 206 such that a bottom side of the printed circuit board assembly 206 faces a bottom side of the PCB assembly 226. In some embodiments, the PCB assembly 206 and the PCB assembly 226 can be configured for horizontal insertion into a 2 rack unit or 2U chassis. In some embodiments, the PCB assembly 206 and the PCB assembly 226 include 24 memory slots each. For example, the PCB assembly 206 and the PCB assembly 226 can in total support 48 memory modules (e.g., DIMMs) in a 2U chassis.

Embodiments herein are described with respect to horizontal PCB assemblies, however, it is appreciated that embodiments include PCB assemblies arranged in vertical orientations (e.g., a blade type orientation). In some embodiments, the PCB assembly 206 and the PCB assembly 226 can be in a vertical orientation with respect to a bottom of a system (e.g., a rack unit system). In some embodiments, the PCB assembly 206 and the PCB assembly 226 may be configured for vertical insertion into a 4 rack unit (4U) chassis (e.g., Electronic Industries Alliance (EIA) rack units, EIA-310, non-EIA rack units, Open Compute Project (OCP) rack units, etc.) along with more PCB assemblies substantially similar to PCB assembly 206.

The printed circuit board assembly 206 includes components 230-232 on the bottom side (e.g., the other side) of the printed circuit board assembly 206. The printed circuit board assembly 226 includes components 240-242 on the bottom side of the printed circuit board assembly 226. The components 230-232 and 240-242 can include any of a variety of components including, but not limited to, one or more memory controllers, one or more circuits (e.g., a memory controller, general purpose processor, specialized graphics processing unit (GPU), a field-programmable gate array (FPGA), an application-specific integrated circuit (ASIC), etc.) with associated heatsinks, one or more buffers, one or more memory slots, one or more interfaces (e.g., for a mezzanine card), a dual in-line memory module (DIMM) slot or interface, a DIMM, a load reduced DIMM (LRDIMM) slot or interface, a LRDIMM memory module, a registered DIMM (RDIMM) slot or interface, a RDIMM memory module, an unregistered DIMM (UDIMM) slot or interface, a UDIMM memory module, a small outline dual in-line memory module (SODIMM) slot or interface, a SODIMM memory module, a low profile (LP) dual in-line memory module (DIMM) slot or interface, a LP DIMM memory module, a very low profile (VLP) DIMM slot or interface, a VLP DIMM memory module, etc. In some embodiments, the circuit layout of the printed circuit board assembly 206 is identical to the circuit layout of the printed circuit board assembly 226. In some embodiments, the PCB assembly 206 and the PCB assembly 226 may be identical (e.g., same stock keeping unit (SKU)).

Advantageously, the inverted orientation of the printed circuit board assembly 226 with respect to the PCB assembly 206 allows components 230-232 to be nested with components 240-242. That is, the PCB assembly 226 may be placed upside down and rotated along a horizontal place 180 degrees with respect to the PCB assembly 206. In this manner, the components 230-232 and 240-242 may be mounted in an alternating, interleaved configuration. As shown in FIG. 2, a first portion (e.g., the components 230-232) of the PCB assembly 206 and a second portion (e.g., the components 240-242) of PCB assembly 226 occupy a plane 250 parallel to PCB assembly 206 and PCB assembly 226.

In some embodiments, the printed circuit board assembly 206 and the printed circuit board assembly 226 are arranged with mechanical clearance with respect to each other such that the printed circuit board assembly 206 is decouplable from a socket (e.g., socket 110) without decoupling the printed circuit board assembly 226 from a socket (e.g., socket 112). In some embodiments, the printed circuit board assembly 206 and the printed circuit board assembly 226 are hot pluggable (e.g., to the back plane 110). The printed circuit board assembly 206 and the printed circuit board assembly 226 can be configured to be arranged with mechanical clearance sufficient to allow coupling of the printed circuit board assembly 206 to the socket 110. In other embodiments, the printed circuit board assembly 206 and the printed circuit board assembly 226 are interlocked.

For example, the printed circuit board assembly 206 can have a first controller on its bottom side and the printed circuit board assembly 226 can have a second controller on its bottom side. The first controller and the second controller may have mechanical clearance sufficient to allow coupling of the printed circuit board assembly 206 to the socket 110. As another example, the printed circuit board assembly 206 includes a first heatsink on its bottom side and the printed circuit board assembly 226 includes a second heatsink on its bottom side. The first heatsink and the second heatsink have mechanical clearance sufficient to allow coupling of the printed circuit board assembly 206 to the socket 110. In some embodiments, the distance and mechanical clearances between components 230-232 and 240-242 are configured to thermally decouple components 230-232 from components 240-242.

The PCB assembly 206 has a height 260 (e.g., in a horizontal orientation) and the PCB assembly 226 has a height 262. The nesting, interleaving, etc., of the PCB assembly 206 and the PCB assembly 226 results in the combined height 270 of the PCB 206 and the PCB assembly 226 which is inverted with respect to the PCB assembly 206. The combined height 270 of the PCB assembly 206 and the PCB assembly 226 is less than the combined height of the PCB 206 and the PCB assembly 226 when the PCB assembly 226 is in a non-inverted orientation or non-interleaved orientation with respect to the PCB assembly 206. For example, with memory modules of 1.35 inches high (e.g., a D IMM memory module) and a 2U chassis of 3.5 inches high, the reduced combined height 270 of the PCB assembly 206 and the PCB assembly 226 being interleaved advantageously allows the PCB assembly 206 and the PCB assembly 226 be inserted into a 2U chassis. The combined height of the PCB 206 and the PCB assembly 226 when the PCB assembly 226 is in a non-inverted orientation, or non-interleaved orientation, with respect to the PCB assembly 206 would be greater than a 2U chassis. Embodiments thus result in improved clearance, thermal solutions (e.g., thermal decoupling), and ease of service.

Figure 3:
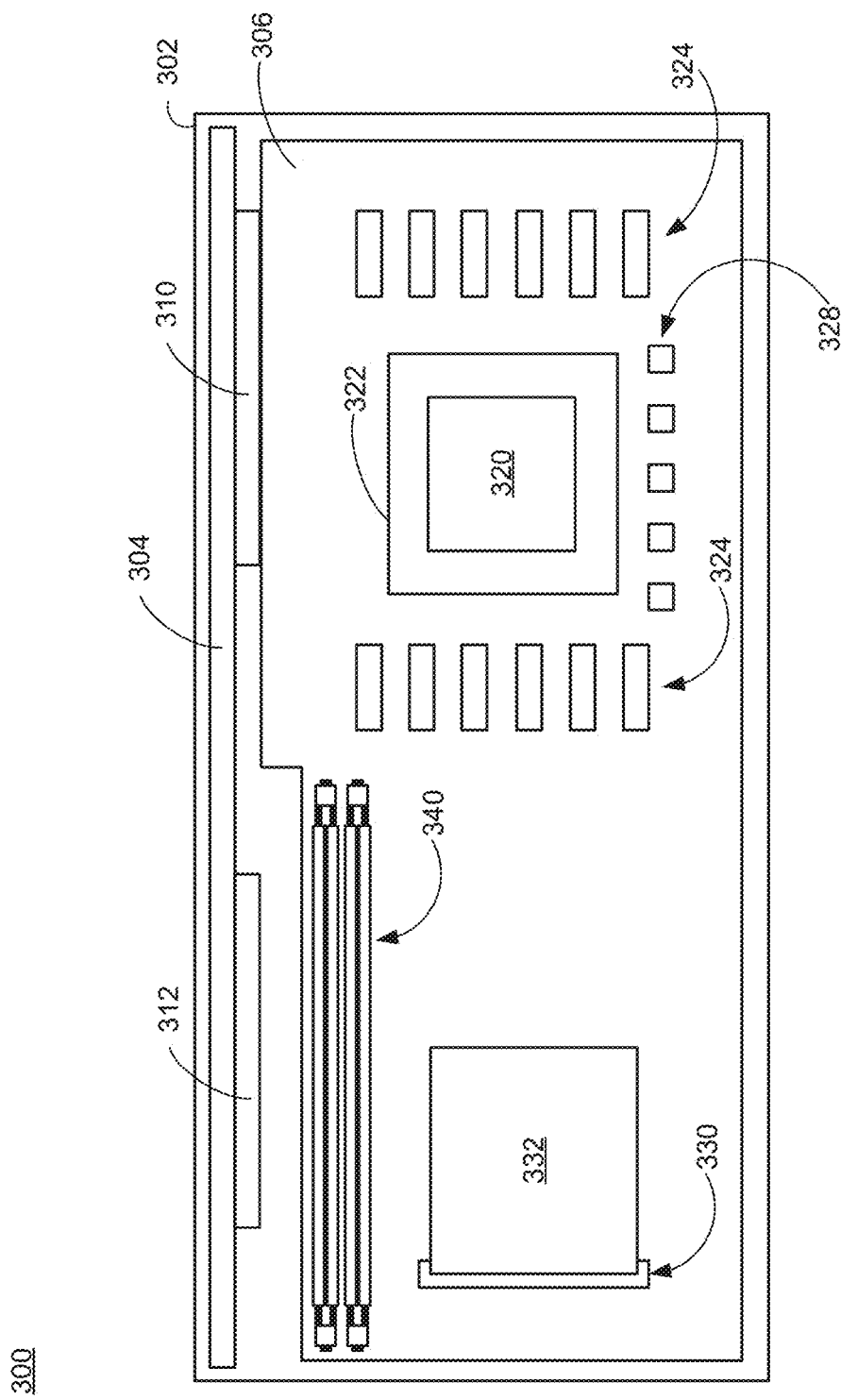
FIG. 3 is a block diagram of a bottom view of a printed circuit board, in accordance with various embodiments.

FIG. 3 is a block diagram of a bottom view of a printed circuit board, in accordance with various embodiments. FIG.

3 depicts a system 300 with a PCB rack unit configuration showing a bottom side of a PCB assembly (e.g., the bottom side of PCB assembly 106). The system 300 includes chassis 302 which includes a backplane 304 and may include one or more printed circuit board assemblies, such as a printed circuit board assembly 306. The backplane 304 includes sockets 310-312 which are operable for coupling to a printed circuit board assembly (e.g., the printed circuit board assembly 306). In some embodiments, the socket 312 is inverted with respect to the socket 310. The printed circuit board assembly 306 includes an interface (not shown) (e.g., within the socket 110) which is configured for communicatively, electrically, etc., coupling the printed circuit board assembly 306 to the backplane 304. In some embodiments, the printed circuit board assembly 306 is hot pluggable to the backplane 304.

The PCB assembly 306 may have support for any of a variety of components including, but not limited to, one or more memory controllers, one or more circuits (e.g., a memory controller, a processor, a GPU, a FPGA, an ASIC, etc.) with associated heatsinks, one or more buffers, one or more memory slots, one or more interfaces (e.g., for a mezzanine card), a SODIMM slot or interface, a SODIMM, a LP DIMM slot or interface, a LP DIMM, a VLP DIMM slot or interface, a VLP DIMM, etc. The components, devices, etc., discussed with respect to FIG. 3 are exemplary and a side (e.g., bottom or top) of a PCB assembly may have more or fewer components that shown in FIG. 3. The components 320-340 described below may be located such that insertion of the PCB assembly 306 into chassis 302 has sufficient mechanical clearance when inserted adjacent to an inverted PCB assembly (e.g., the PCB assembly 226).

In some embodiments, the PCB assembly 306 includes a controller 320 which may be configured for handling communications between components coupled to the PCB assembly 306 and/or communications of PCB assembly 306 with backplane 304. For example, the controller 320 may be a memory controller. In some embodiments, the PCB assembly 306 includes a heatsink 322 configured for dissipating heat from the controller 320. The heatsink 322 may be configured for thermally decoupling the controller 320 from a controller on an adjacent inverted PCB assembly (e.g., the PCB 226). In some embodiments, the controller 320 and/or heatsink 322 may be located off-center to increase thermal dissipation thereby increasing the distance of the controller 320 and/or heatsink 322 from another controller and/or heatsink on a nested and interleaved inverted PCB assembly.

In some embodiments, the PCB assembly 306 includes a plurality of buffer memory units 324. The buffers may be used for communications between the controller 320 and one or more memory modules (e.g., memory modules in the memory slots 108, the memory modules 208a-b, memory modules in the memory slots 340, etc.).

In some embodiments, the PCB assembly 306 includes a plurality of electric components 328. The electronic components 328 may include one or more inductors, capacitors, resistors, memristors, etc., that may be associated with components on either side of a PCB assembly (e.g., the PCB assembly 106, the PCB assembly 306, etc.).

In some embodiments, the PCB assembly 306 also includes the memory slots 340 which are configured for coupling one or more: LRDIMMs, RDIMMs, UDIMMs, SODIMMs, LP DIMMs, VLP DIMMs, etc. In one embodiment, the PCB assembly 306 may have memory slots for a fraction (e.g., half) of the memory slots on the other side of the PCB assembly 306. For example, if the other side of the PCB assembly 306 (e.g., the top of the PCB assembly 106) has 24 memory slots, the PCB assembly 306 will have 12 memory slots.

The PCB assembly 306 can include an interface 330 configured for coupling to a PCB assembly 332. In some embodiments, the interface 330 may be a mini peripheral Component Interconnect Express (PCI express) interface, mini serial AT attachment (mini-SATA or mSATA) interface, M.2 (Next Generation Form Factor (NGFF)) interface, SATA Express interface, etc. In some embodiments, the PCB assembly 332 can be a daughterboard, daughtercard, mezzanine board, mezzanine card, piggyback board, etc. In some embodiments, the PCB assembly 332 can be configured to provide redundancy for one or more components coupled to the PCB assembly 306.

Figure 4:
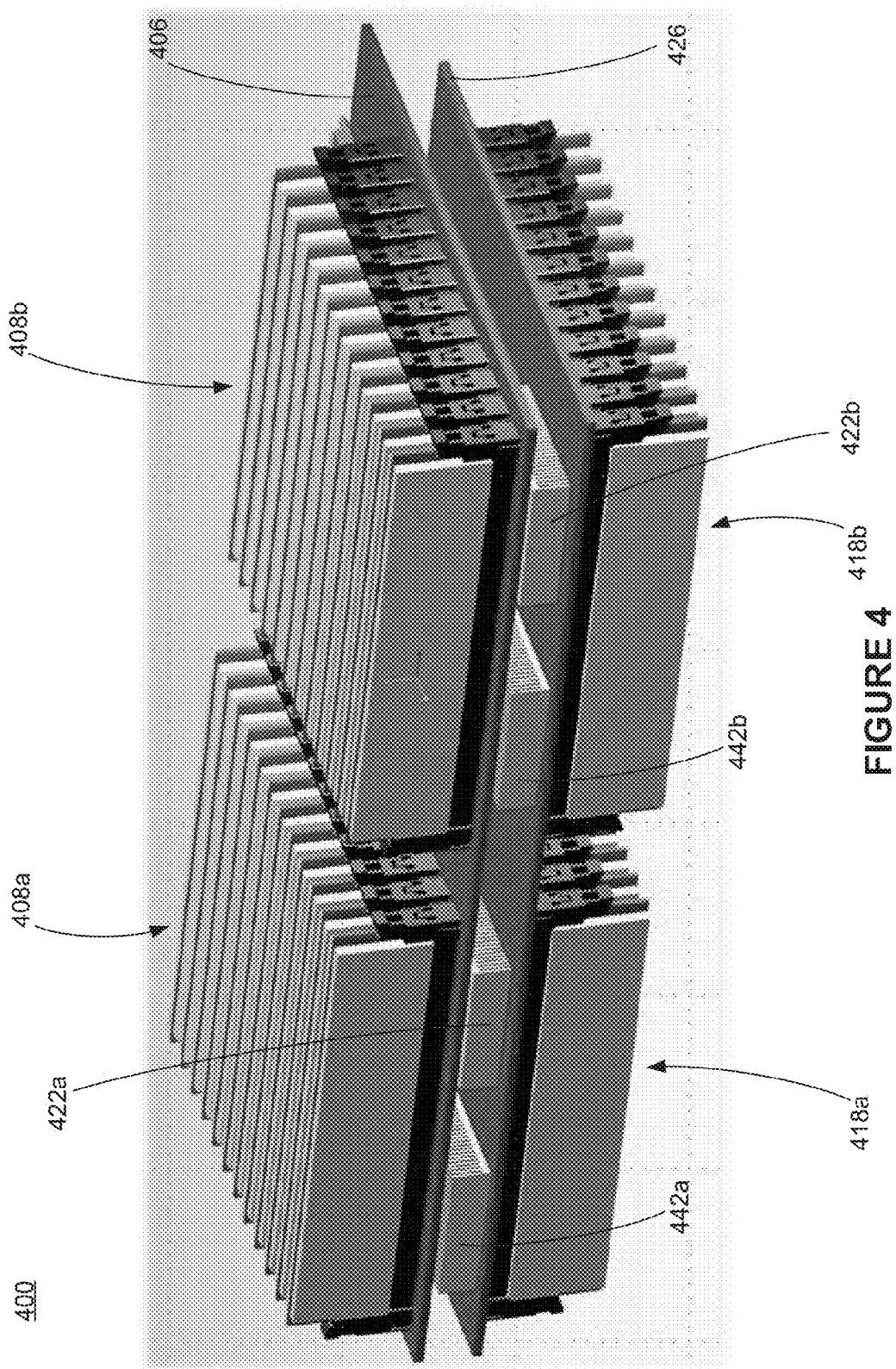
FIG. 4 shows a three dimensional card ejector side view of a plurality of PCB assemblies, in accordance with various embodiments.

FIG. 4 shows a three dimensional card ejector side view of a plurality of printed circuit board (PCB) assemblies, in accordance with various embodiments. FIG. 4 depicts a PCB rack unit configuration 400 including a PCB assembly 406 (e.g., the PCB assembly 206) and a PCB assembly 426 (e.g., the PCB assembly 226). The PCB assembly 406 as shown includes a plurality of memory slots 408a and a plurality of memory slots 408b on a top side of the PCB assembly 406 with associated memory modules. The PCB assembly 426 as shown includes a plurality of memory slots 418a and a plurality of memory slots 418b on a top side of the PCB assembly 426 with associated memory modules.

The PCB assembly 406 includes heatsinks 422a-b located on its bottom side. The PCB assembly 426 includes heatsinks 442a-b on its bottom side. The heatsinks 422a-b and 442a-b may be used to cool various components (e.g., controller, circuits, etc.) of the PCB assembly 406 and the PCB assembly 426.

The PCB assembly 426 is inverted with respect the PCB assembly 406. The heat sinks 422a-b and 442a-b are nested or interleaved allowing the PCB assembly 406 and the PCB assembly 426 to advantageously occupy less space than if the PCB assembly 406 and the PCB assembly 426 were not nested or interleaved.

Figure 5:
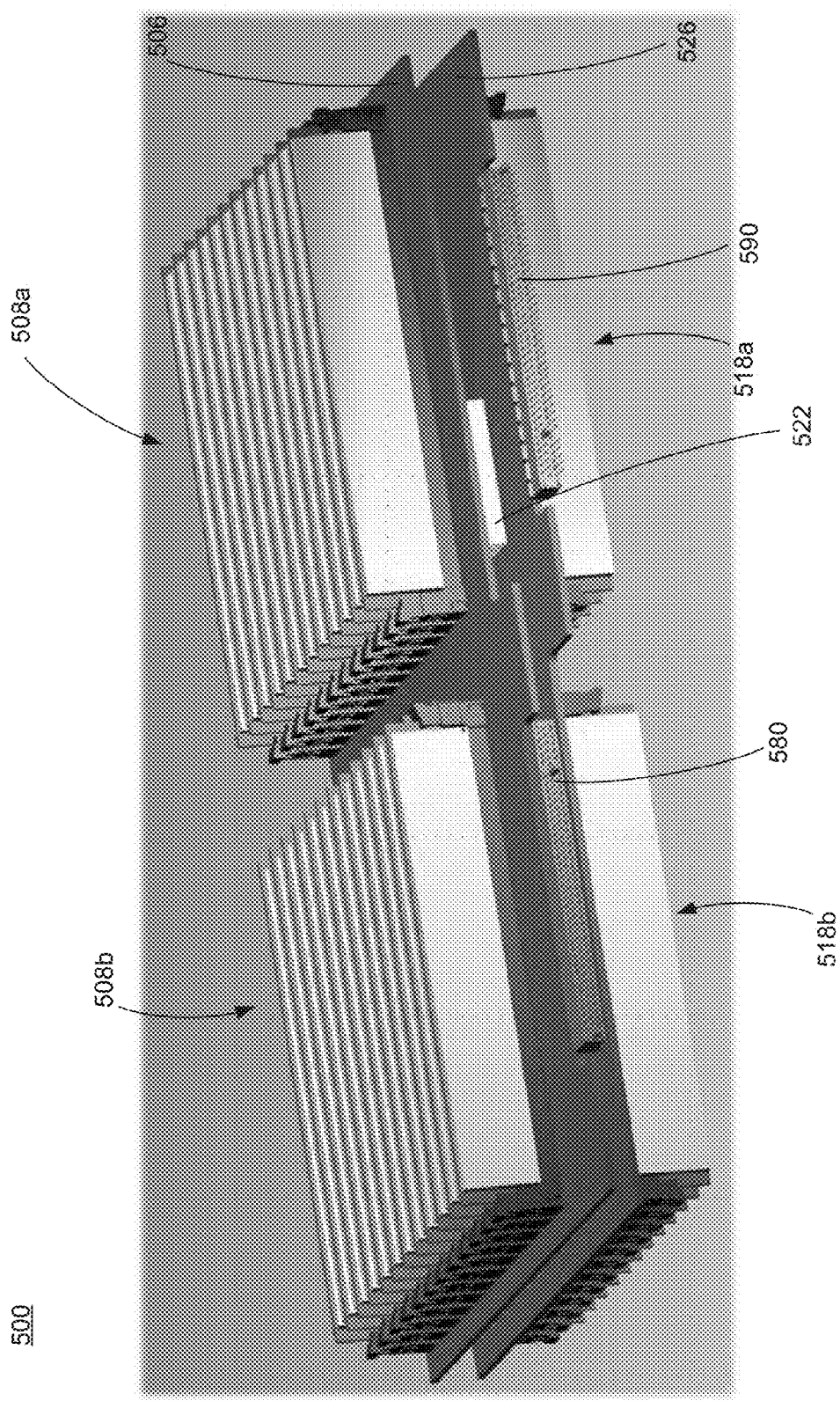
FIG. 5 shows a three dimensional backplane connector side view, in accordance with various embodiments.

FIG. 5 shows a three dimensional connector backplane side view, in accordance with various embodiments. FIG. 5 depicts a PCB rack unit configuration 500 including a PCB assembly 506 (e.g., the PCB assembly 206) and a PCB assembly 526 (e.g., the PCB assembly 226). The PCB assembly 526 is inverted with respect to the PCB assembly 506. The PCB assembly 506 as shown includes a plurality of memory slots 508a and a plurality of memory slots 508b on a top side of the PCB assembly 506 with associated memory modules. The PCB assembly 506 includes heatsink 522 which is configured to cool various components (e.g., controller, circuits, etc.) of the PCB assembly 506. The heatsink 522 may be nested or interleaved with various components of the PCB assembly 526 thereby allowing the PCB assembly 506 and the PCB assembly 526 to occupy less space than if the PCB assembly 506 and the PCB assembly 526 were not nested or interleaved. The PCB assembly 506 further includes interface 580 (e.g., a PCI express interface, Edgeline by Molex Inc., of Lisle, Ill., etc.) configured for communicatively, electrically, etc., coupling the PCB assembly 506 to a backplane (e.g., the backplane 110) via a socket (e.g., the socket 110).

The PCB assembly 526 as shown includes a plurality of memory slots 518a and a plurality of memory slots 518b on its top side with associated memory modules. The PCB assembly 526 further includes interface 590 (e.g., a standard memory channel, PCI express, network or custom memory channel interface) configured for communicatively coupling the PCB assembly 506 to a backplane (e.g., the backplane 110) via a socket (e.g., the socket 112).

Figure 6:
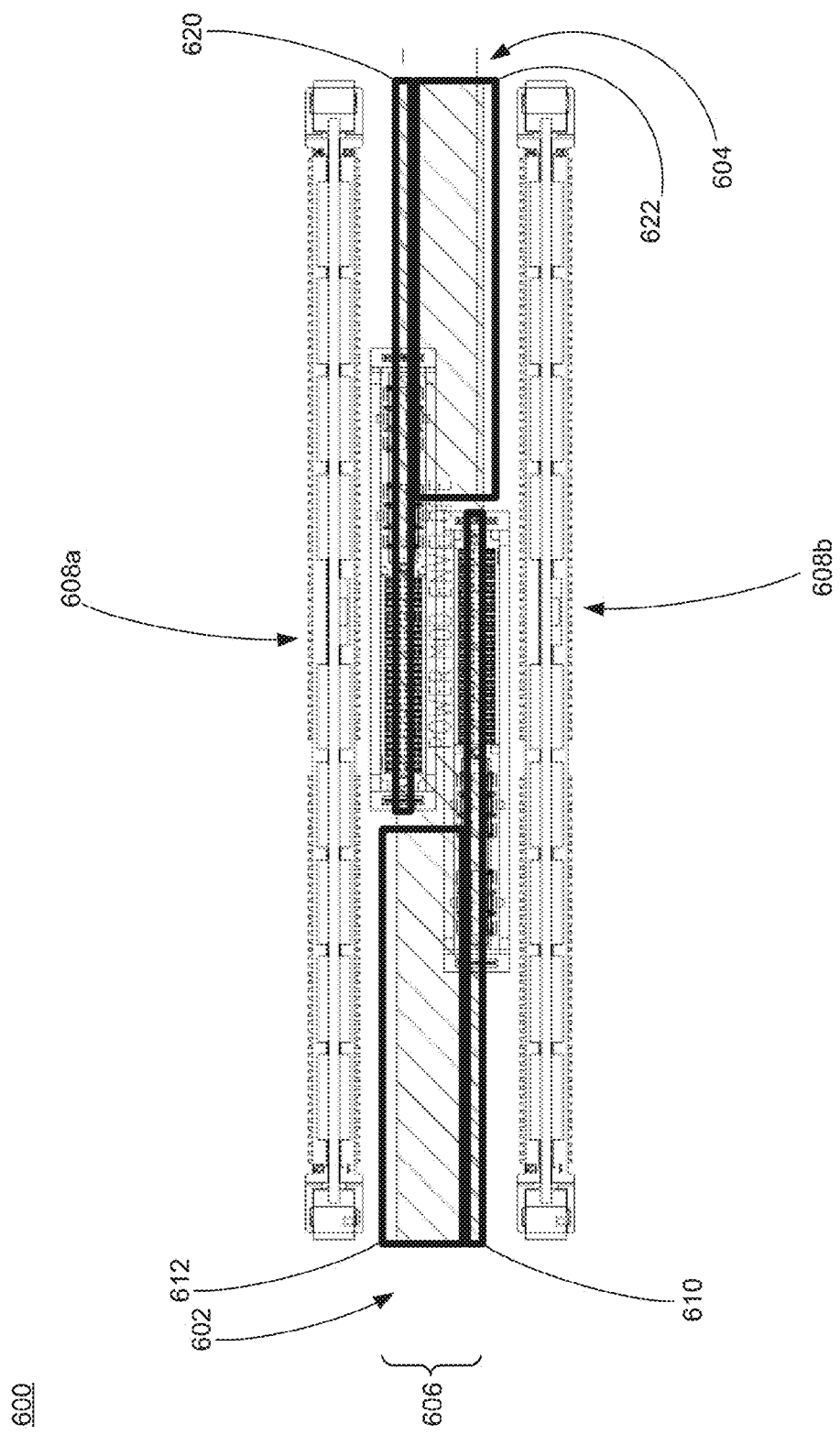
FIG. 6 shows a top view of a plurality of power modules, in accordance with various embodiments.

FIG. 6 shows a top view of a plurality of power modules, in accordance with various embodiments. FIG. 6 depicts a portion 600 of a PCB assembly (e.g., the PCB assembly 106) including nested or interleaved power modules 602-604 between two memory slots 608a-b. In some embodiments, the plurality of power modules 602-604 may be located on a top side of PCB assembly (e.g., the top of PCB assembly 106) or a bottom side of a PCB assembly (e.g., the bottom of PCB assembly 306). In some embodiments, the plurality of power modules 602-604 may be configured to handle the power management of twelve memory slots and associated memory modules. For example, the PCB assembly 106 including 24 memory slots may further include two pairs of power modules 602-604 (e.g., four total power modules) with each pair configured for managing the power of 12 memory slots and associated memory modules.

The portion 600 of the PCB assembly includes a power module envelope 606 including the power modules 602 and 604. The power module 602 is configured for managing the power of a plurality of memory slots and associated memory modules. In some embodiments, the power module 602 includes a circuit board 610 and power device or components 612. The circuit board 610 and power device 612 are configured for managing the power of a plurality of memory slots and associated memory modules. In some embodiments, the power module 604 is configured for managing the power of a plurality of memory slots and associated memory modules. The power module 604 includes a circuit board 620 and power device or components 622. The circuit board 620 and power device 622 are configured for managing the power of a plurality of memory slots and associated memory modules.

The power modules 602-604 are nested or interleaved thereby allowing the power modules 602-604 to occupy less space on a PCB assembly than if the power modules 602-604 were in the same orientation. For example, the power module 602 is inverted with respect to the power module 604.

Figure 7:
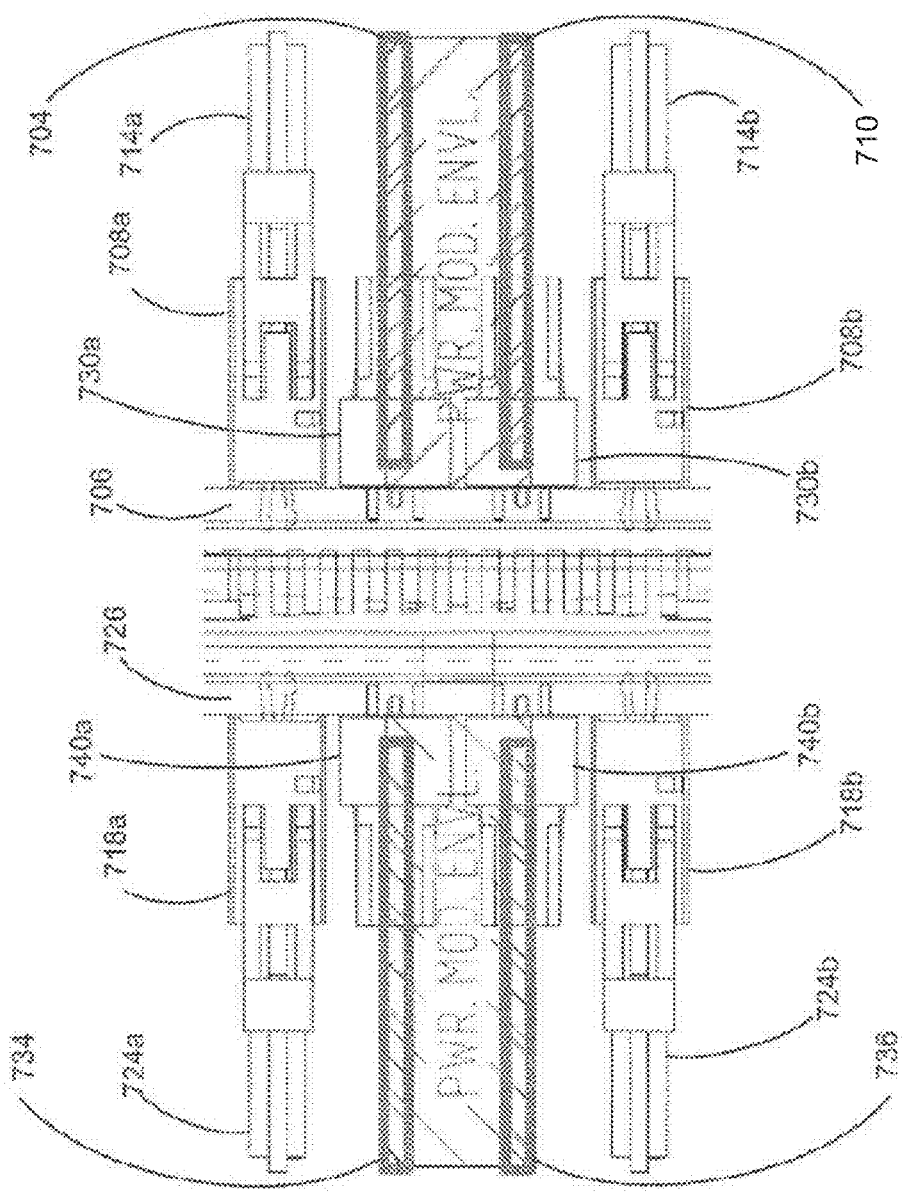
FIG. 7 shows a side view of a plurality of power modules, in accordance with various embodiments.

FIG. 7 shows a side view of a plurality of power modules, in accordance with various embodiments. FIG. 7 depicts a cross sectional portion 700 with a PCB rack unit configuration (e.g., of the system 200) including a PCB assembly 706 (e.g., the PCB assembly 206) and a PCB assembly 726 (e.g., the PCB assembly 226). The PCB assembly 726 is inverted with respect to the PCB assembly 706. The PCB assembly 706 includes memory slots 708a-b (e.g., the memory slot 208a), memory modules 714a-b (e.g., the memory module 214a), power module sockets 730a-b, and power modules 704, 710. The power module sockets 730a-b are configured for coupling of power modules 704, 710 to the PCB assembly 706 to enable power management by the power modules 704, 710.

The PCB assembly 726 includes memory slots 718a-b (e.g., the memory slots 218a-b), memory modules 724a-b (e.g., the memory module 224a), power module sockets 740a-b, and power modules 734-736 (e.g., the power modules 602-604). The power module sockets 740a-b are configured for coupling of power modules 734-736 to the PCB assembly 726 to enable power management by the power modules 734-736.

In some embodiments, the power module sockets 730a-b allow the power modules 704, 710 to be nested and interleaved and thereby occupy less space than if not nested and interleaved or in the same orientation. The power module sockets 740a-b allow the power modules 734-736 to be nested and interleaved and thereby occupy less space than if not nested and interleaved or in the same orientation. In some embodiments, the power module sockets 730a-b and 740a-b may be configured to allow hot plugging of power modules 704, 710 and 734-736. The power modules 704, 710 may be coupled individually to an associated power module socket due to having mechanical clearance allowing the insertion, coupling, removal decoupling, etc., from a power module socket without disturbing an adjacent power module. In some embodiments, the power modules 704, 710 may have components located to increase thermal decoupling of components on an adjacent power module or component and thereby increase thermal dissipation. For example, when the power modules 704, 710 are in a nested configuration, the components that generate the most heat may be at opposite ends.

Figure 8:
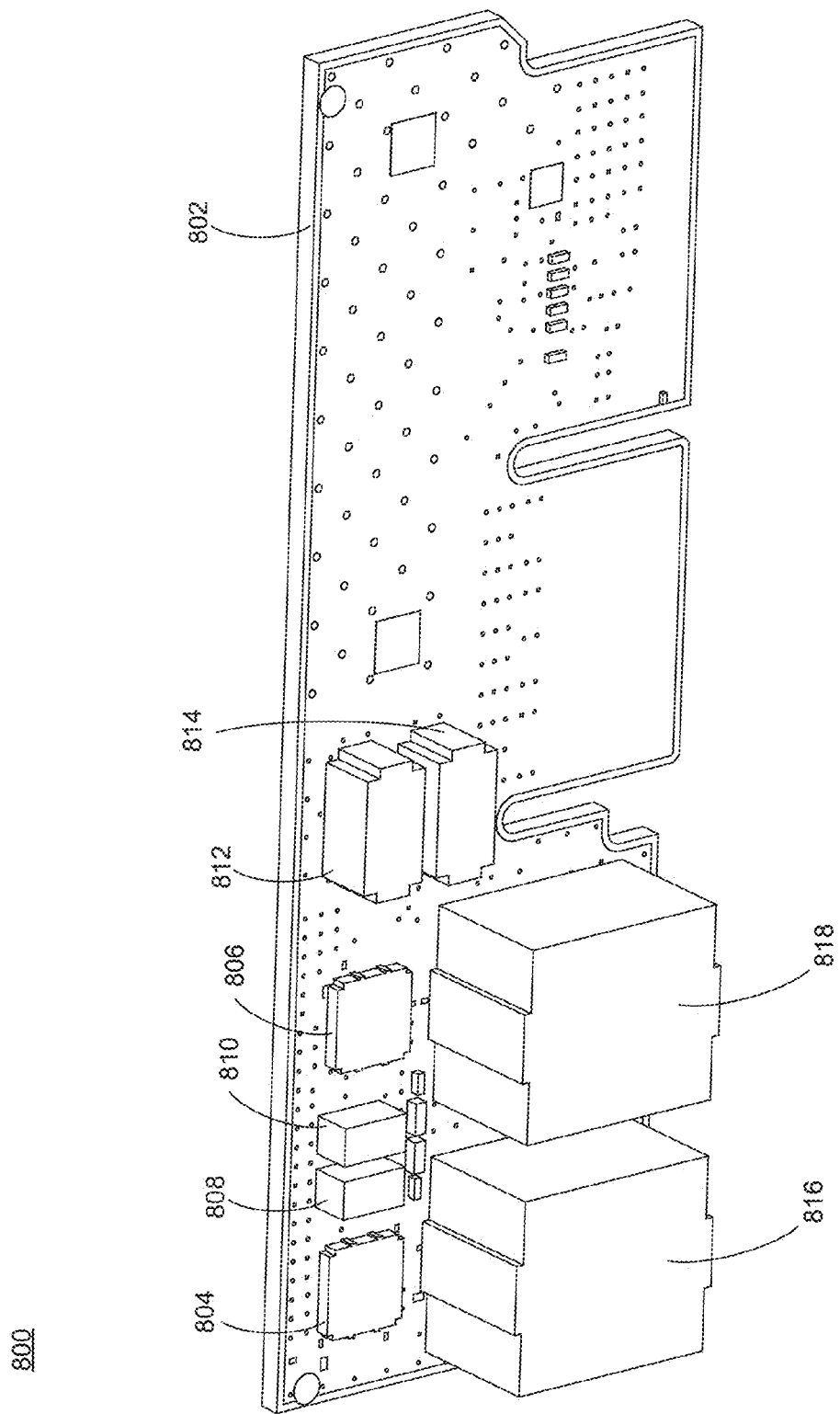
FIG. 8 shows a three dimensional front view of a power module, in accordance with various embodiments.

FIG. 8 shows a three dimensional front view of a power module (e.g., the power module 602), in accordance with various embodiments. FIG. 8 depicts an illustrative layout of components of a power module that allows one or more power modules to be nested and interleaved. The power module 802 includes transistors 804-806 (e.g., a field-effect transistor (FET), metal-oxide-semiconductor field-effect transistor (MOSFET), etc.), capacitors 808-810, and inductors 812-818. The transistors 804-806, capacitors 808-810, and inductors 812-818 are configured along with other components of power module 802 to manage power for one or more components (e.g., memory modules, memory controllers, etc.).

The locations of the transistors 804-806, the capacitors 808-810, and the inductors 812-818 are configured to allow power module 802 to be nested, interleaved, etc., with another power module (e.g., an identical power module or a different power module). The locations of the transistors 804-806, the capacitors 808-810, and the inductors 812-818 can further be configured to allow power module 802 to be coupled and/or decoupled from a PCB assembly (e.g., the PCB assembly 706) with sufficient mechanical clearance so as to not interfere with other components (e.g., other power modules, memory slots, memory modules, etc.).

Figure 9:
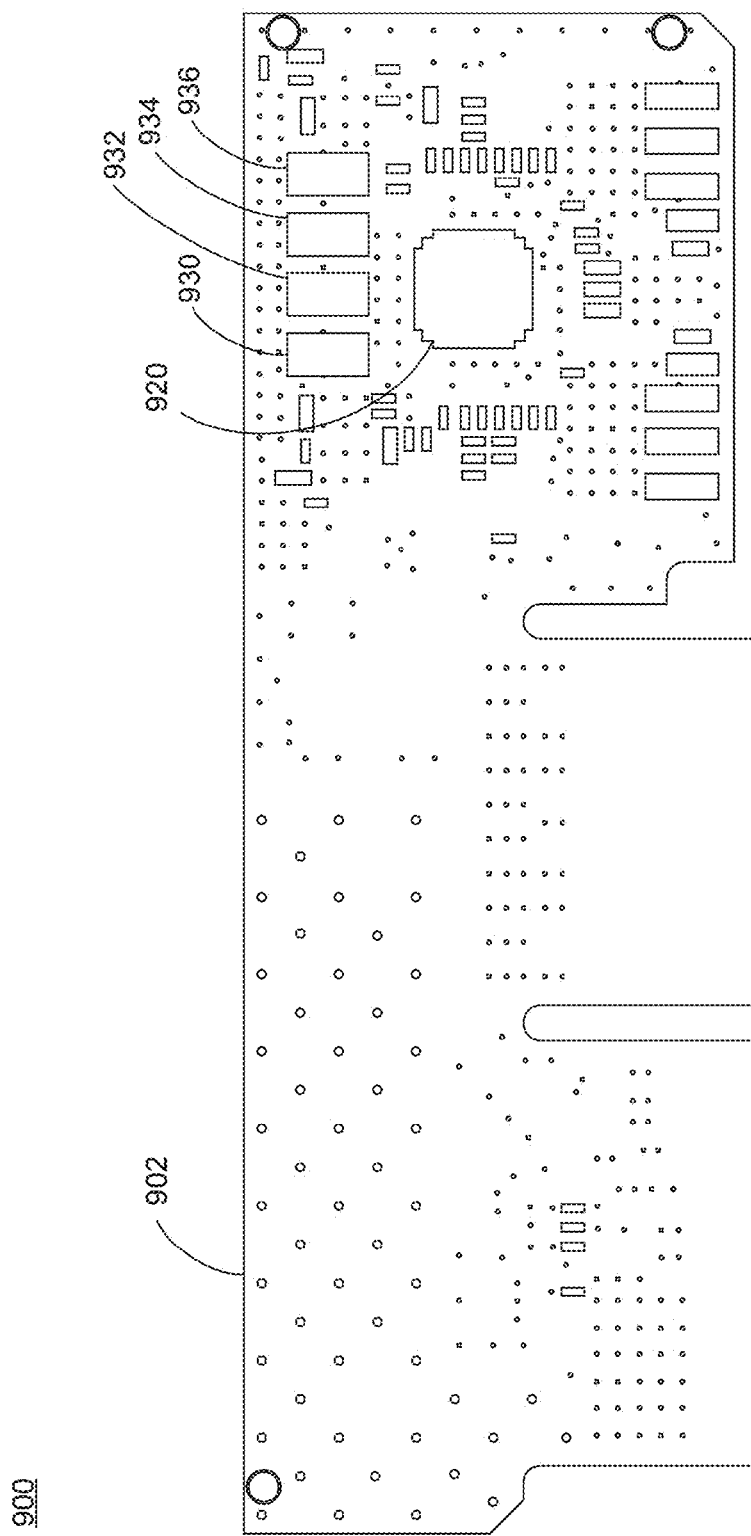
FIG. 9 shows a back view of a power module, in accordance with various embodiments.

FIG. 9 shows a back view of a power module, in accordance with various embodiments. FIG. 9 depicts an illustrative layout of components of a power modules that allows one or more power modules to be nested and interleaved. The power module 902 includes a circuit 920 and capacitors 930-936. The circuit 920 may be a power management controller configured to manage power along with other components of power module 802 for one or more components (e.g., memory modules, memory controllers, etc.).

The locations of the circuit 920 and the capacitors 930-936 are configured to allow power module 902 to be nested and interleaved with another power module (e.g., an identical power module or a different power module). The locations of the circuit 920 and the capacitors 930-936 may further be configured to allow power module 902 to be coupled and/or decoupled from a PCB assembly (e.g., the PCB assembly 706) with sufficient mechanical clearance so as to not interfere with other components (e.g., other power modules, memory slots, memory modules, etc.).

Figure 10:
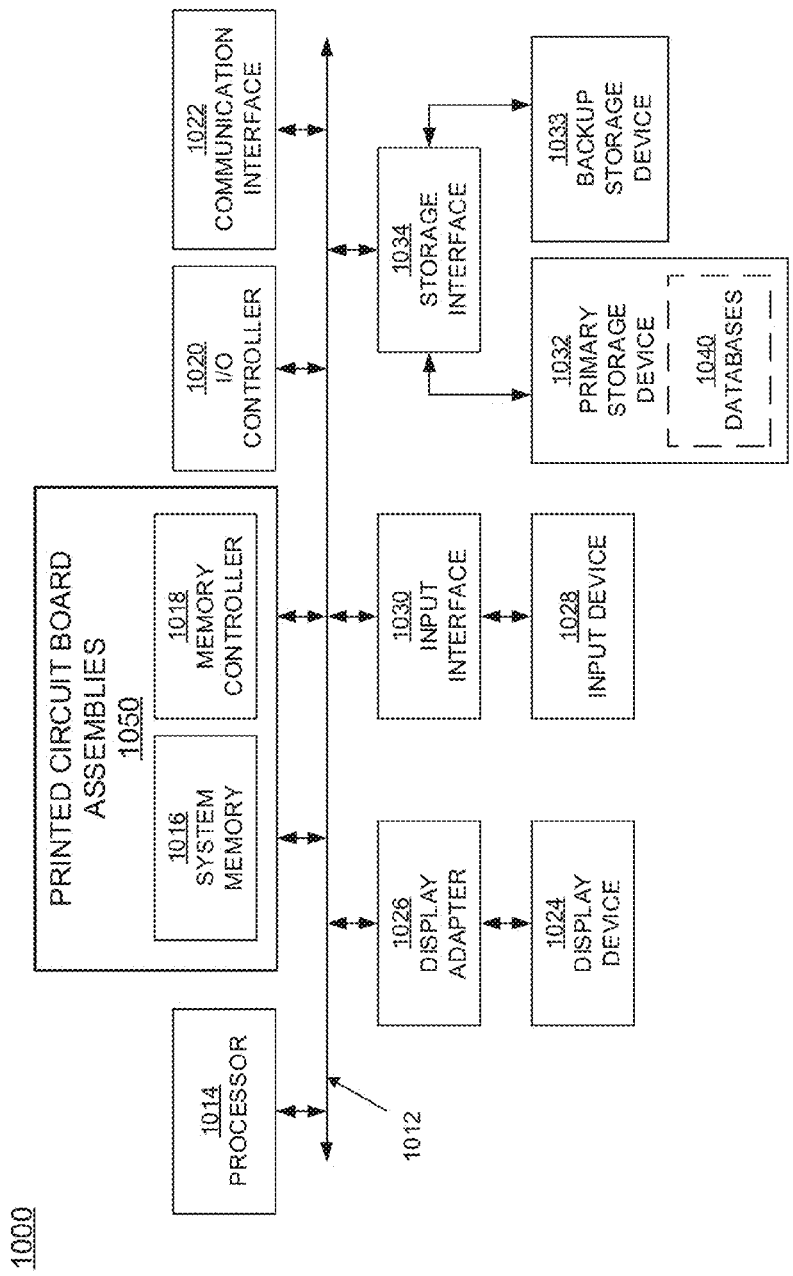
FIG. 10 is a block diagram of an example of an exemplary computing system including various embodiments.

FIG. 10 is a block diagram of an example of an exemplary computing system 1000 including various embodiments. Computing system 1000 broadly represents any single or multi-processor computing device or system capable of executing computer-readable instructions. Examples of computing system 1000 include, without limitation, workstations, laptops, client-side terminals, servers, distributed computing systems, handheld devices, or any other computing system or device. In its most basic configuration, computing system 1000 may include at least one processor 1014 and a system memory 1016.

Processor 1014 generally represents any type or form of processing unit capable of processing data or interpreting and executing instructions. In certain embodiments, processor 1014 may receive instructions from a software application or module. These instructions may cause processor 1014 to perform the functions of one or more of the example embodiments described and/or illustrated herein. For example, processor 1014 may perform and/or be a means for performing, either alone or in combination with other elements, one or more of the identifying, determining, using, implementing, translating, tracking, receiving, moving, and providing described herein. Processor 1014 may also perform and/or be a means for performing any other steps, methods, or processes described and/or illustrated herein.

System memory 1016 generally represents any type or form of volatile or non-volatile storage device or medium capable of storing data and/or other computer-readable instructions. Examples of system memory 1016 include, without limitation, RAM, ROM, FLASH memory, or any other suitable memory device. Although not required, in certain embodiments computing system 1000 may include both a volatile memory unit (such as, for example, system memory 1016) and a non-volatile storage device (such as, for example, primary storage device 1032.

Computing system 1000 may also include one or more components or elements in addition to processor 1014 and system memory 1016. For example, in the embodiment of FIG. 10, computing system 1000 includes a memory controller 1018, an I/O controller 1020, and a communication interface 1022, each of which may be interconnected via a communication infrastructure 1012.

Communication infrastructure 1012 generally represents any type or form of infrastructure capable of facilitating communication between one or more components of a computing device. Examples of communication infrastructure 1012 include, without limitation, a communication bus (such as an ISA, PCI, PCIe, or similar bus) and a network. In one embodiment, system memory 1016 communicates via a dedicated memory bus.

Memory controller 1018 generally represents any type or form of device capable of handling memory or data or controlling communication between one or more components of computing system 1000. For example, memory controller 1018 may control communication between processor 1014, system memory 1016, and I/O controller 1020 via communication infrastructure 1012. Memory controller may perform and/or be a means for performing, either alone or in combination with other elements, one or more of the operations or features described herein. In some embodiments, the system memory 1016 and/or the memory controller 1018 may be included in one or more printed circuit board assemblies 1050, as described herein.

I/O controller 1020 generally represents any type or form of module capable of coordinating and/or controlling the input and output functions of a computing device. For example, I/O controller 1020 may control or facilitate transfer of data between one or more elements of computing system 1000, such as processor 1014, system memory 1016, communication interface 1022, display adapter 1026, input interface 1030, and storage interface 1034. I/O controller 1020 may be used, for example, to perform and/or be a means for performing, either alone or in combination with other elements, one or more of the operations described herein. I/O controller 1020 may also be used to perform and/or be a means for performing other operations and features set forth in the instant disclosure.

Communication interface 1022 broadly represents any type or form of communication device or adapter capable of facilitating communication between example computing system 1000 and one or more additional devices. For example, communication interface 1022 may facilitate communication between computing system 1000 and a private or public network including additional computing systems. Examples of communication interface 1022 include, without limitation, a wired network interface (such as a network interface card), a wireless network interface (such as a wireless network interface card), a modem, and any other suitable interface. In one embodiment, communication interface 1022 provides a direct connection to a remote server via a direct link to a network, such as the Internet. Communication interface 1022 may also indirectly provide such a connection through, for example, a local area network (such as an Ethernet network), a personal area network, a telephone or cable network, a cellular telephone connection, a satellite data connection, or any other suitable connection.

Communication interface 1022 may also represent a host adapter configured to facilitate communication between computing system 1000 and one or more additional network or storage devices via an external bus or communications channel. Examples of host adapters include, without limitation, SCSI host adapters, USB host adapters, IEEE (Institute of Electrical and Electronics Engineers) 1394 host adapters, Serial Advanced Technology Attachment (SATA) and External SATA (eSATA) host adapters, Advanced Technology Attachment (ATA) and Parallel ATA (PATA) host adapters, Fibre Channel interface adapters, Ethernet adapters, or the like. Communication interface 1022 may also allow computing system 1000 to engage in distributed or remote computing. For example, communication interface 1022 may receive instructions from a remote device or send instructions to a remote device for execution. Communication interface 1022 may perform and/or be a means for performing, either alone or in combination with other elements, one or more of the operations disclosed herein. Communication interface 1022 may also be used to perform and/or be a means for performing other operations and features set forth in the instant disclosure.

As illustrated in FIG. 10, computing system 1000 may also include at least one display device 1024 coupled to communication infrastructure 1012 via a display adapter 1026. Display device 1024 generally represents any type or form of device capable of visually displaying information forwarded by display adapter 1026. Similarly, display adapter 1026 generally represents any type or form of device configured to forward graphics, text, and other data from communication infrastructure 1012 (or from a frame buffer, as known in the art) for display on display device 1024.

As illustrated in FIG. 10, computing system 1000 may also include at least one input device 1028 coupled to communication infrastructure 1012 via an input interface 1030. Input device 1028 generally represents any type or form of input device capable of providing input, either computer- or human-generated, to computing system 1000. Examples of input device 1028 include, without limitation, a keyboard, a pointing device, a speech recognition device, or any other input device. In one embodiment, input device 1028 may perform and/or be a means for performing, either alone or in combination with other elements, one or more of the operations disclosed herein. Input device 1028 may also be used to perform and/or be a means for performing other operations and features set forth in the instant disclosure.

As illustrated in FIG. 10, computing system 1000 may also include a primary storage device 1032 and a backup storage device 1033 coupled to communication infrastructure 1012 via a storage interface 1034. Storage devices 1032 and 1033 generally represent any type or form of storage device or medium capable of storing data and/or other computer-readable instructions. For example, storage devices 1032 and 1033 may be a magnetic disk drive (e.g., a so-called hard drive), a floppy disk drive, a magnetic tape drive, an optical disk drive, a FLASH drive, or the like. Storage interface 1034 generally represents any type or form of interface or device for transferring data between storage devices 1032 and 1033 and other components of computing system 1000.

In one example, databases 1040 may be stored in primary storage device 1032. Databases 1040 may represent portions of a single database or computing device or a plurality of databases or computing devices. For example, databases 1040 may represent (be stored on) a portion of computing system 1000 and/or portions of example network architecture 1100 in FIG. 11 (below). Alternatively, databases 1040 may represent (be stored on) one or more physically separate devices capable of being accessed by a computing device, such as computing system 1000 and/or portions of network architecture 1100.

Continuing with reference to FIG. 10, storage devices 1032 and 1033 may be configured to read from and/or write to a removable storage unit configured to store computer software, data, or other computer-readable information. Examples of suitable removable storage units include, without limitation, a floppy disk, a magnetic tape, an optical disk, a FLASH memory device, or the like. Storage devices 1032 and 1033 may also include other similar structures or devices for allowing computer software, data, or other computer-readable instructions to be loaded into computing system 1000. For example, storage devices 1032 and 1033 may be configured to read and write software, data, or other computer-readable information. Storage devices 1032 and 1033 may also be a part of computing system 1000 or may be separate devices accessed through other interface systems.

Storage devices 1032 and 1033 may be used to perform, and/or be a means for performing, either alone or in combination with other elements, one or more of the operations disclosed herein. Storage devices 1032 and 1033 may also be used to perform, and/or be a means for performing, other operations and features set forth in the instant disclosure.

Many other devices or subsystems may be connected to computing system 1000. Conversely, all of the components and devices illustrated in FIG. 10 need not be present to practice the embodiments described herein. The devices and subsystems referenced above may also be interconnected in different ways from that shown in FIG. 10. Computing system 1000 may also employ any number of software, firmware, and/or hardware configurations. For example, the example embodiments disclosed herein may be encoded as a computer program (also referred to as computer software, software applications, computer-readable instructions, or computer control logic) on a computer-readable medium.

The computer-readable medium containing the computer program may be loaded into computing system 1000. All or a portion of the computer program stored on the computer-readable medium may then be stored in system memory 1016 and/or various portions of storage devices 1032 and 1033. When executed by processor 1014, a computer program loaded into computing system 1000 may cause processor 1014 to perform and/or be a means for performing the functions of the example embodiments described and/or illustrated herein. Additionally or alternatively, the example embodiments described and/or illustrated herein may be implemented in firmware and/or hardware. For example, computing system 1000 may be configured as an ASIC adapted to implement one or more of the embodiments disclosed herein.

Figure 11:
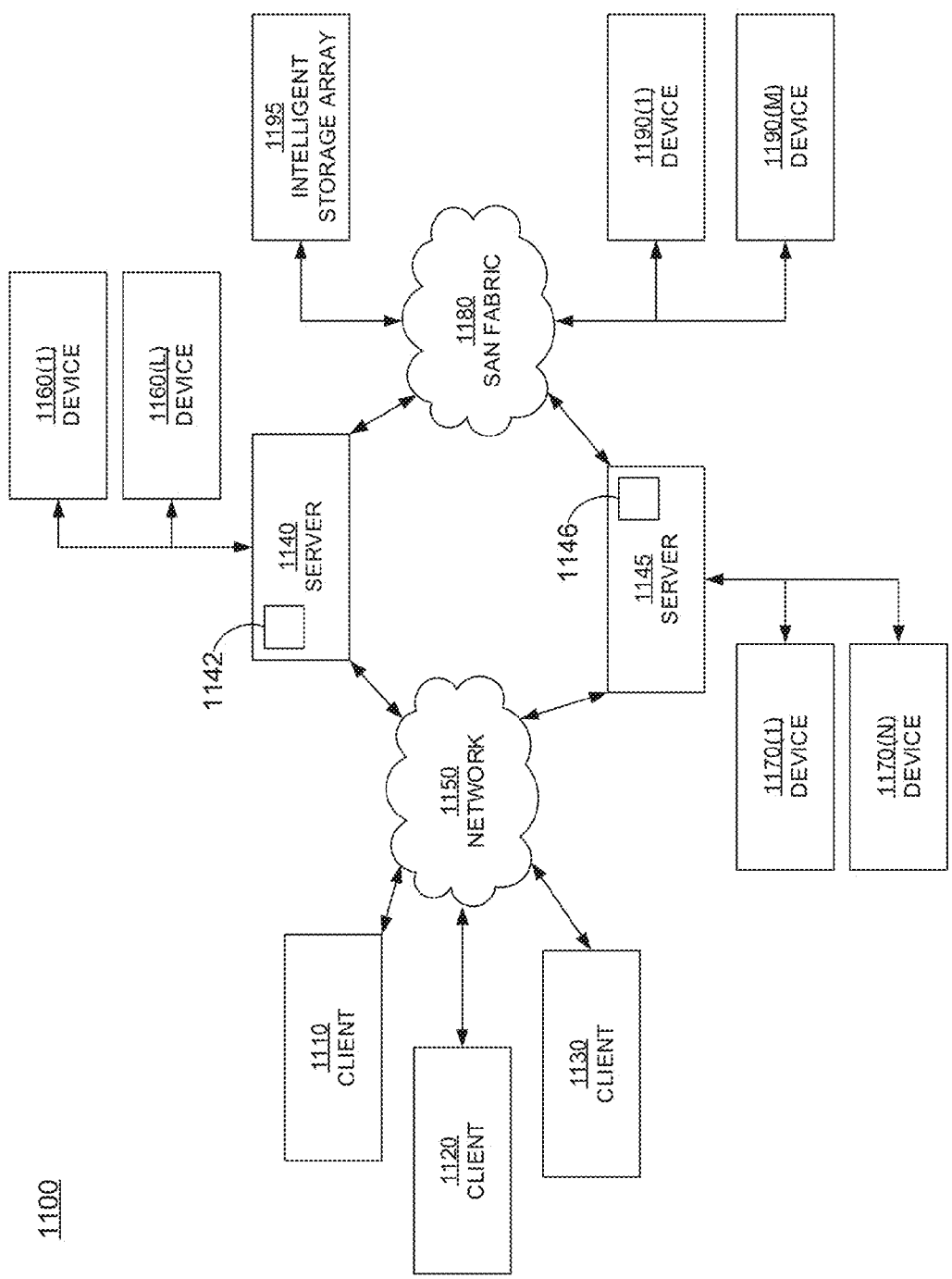
FIG. 11 is a block diagram of an exemplary operating environment, in accordance with various embodiments.

FIG. 11 is a block diagram of an example of an operating environment 1100 in which client systems 1110, 1120, and 1130 and servers 1140 and 1145 may be coupled to a network 1150. Client systems 1110, 1120, and 1130 generally represent any type or form of computing device or system, such as computing system 1000 of FIG. 10.

Similarly, servers 1140 and 1145 generally represent computing devices or systems, such as application servers or database servers, configured to provide various database services and/or run certain software applications. In some embodiments, the servers 1140 may include one or more printed circuit board assemblies 1142, as described herein. In some embodiments, the servers 1145 may include one or more printed circuit board assemblies 1146, as described herein. Network 1150 generally represents any telecommunication or computer network including, for example, an intranet, a WAN, a LAN, a PAN, or the Internet.

As illustrated in FIG. 11, one or more storage devices 1160(1)-(L) may be directly attached to server 1140. Similarly, one or more storage devices 1170(1)-(N) may be directly attached to server 1145. Storage devices 1160(1)-(L) and storage devices 1170(1)-(N) generally represent any type or form of storage device or medium capable of storing data and/or other computer-readable instructions. Storage devices 1160(1)-(L) and storage devices 1170(1)-(N) may represent NAS devices configured to communicate with servers 1140 and 1145 using various protocols, such as NFS, SMB, or CIFS.

Servers 1140 and 1145 may also be connected to a SAN fabric 1180. SAN fabric 1180 generally represents any type or form of computer network or architecture capable of facilitating communication between storage devices. SAN fabric 1180 may facilitate communication between servers 1140 and 1145 and storage devices 1190(1)-(M) and/or an intelligent storage array 1195. SAN fabric 1180 may also facilitate, via network 1150 and servers 1140 and 1145, communication between client systems 1110, 1120, and 1130 and storage devices 1190(1)-(M) and/or intelligent storage array 1195 in such a manner that devices 1190(1)-(M) and array 1195 appear as locally attached devices to client systems 1110, 1120, and 1130. As with storage devices 1160(1)-(L) and storage devices 1170(1)-(N), storage devices 1190(1)-(M) and intelligent storage array 1195 generally represent any type or form of storage device or medium capable of storing data and/or other computer-readable instructions.

With reference to computing system 1000 of FIG. 10, a communication interface, such as communication interface 1022, may be used to provide connectivity between each client system 1110, 1120, and 1130 and network 1150. Client systems 1110, 1120, and 1130 may be able to access information on server 1140 or 1145 using, for example, a Web browser or other client software. Such software may allow client systems 1110, 1120, and 1130 to access data hosted by server 1140, server 1145, storage devices 1160(1)-(L), storage devices 1170(1)-(N), storage devices 1190(1)-(M), or intelligent storage array 1195. Although FIG. 11 depicts the use of a network (such as the Internet) for exchanging data, the embodiments described herein are not limited to the Internet or any particular network-based environment.

The above described embodiments may be used, in whole or in part, in systems that process large amounts of data and/or have tight latency constraints, and, in particular, with systems using one or more of the following protocols and formats: Key-Value (KV) Store, Memcached, Redis, Neo4J (Graph), Fast Block Storage, Swap Device, and Network RAMDisk. In addition, the above described embodiments may be used, in whole or in part, in systems employing virtualization, Virtual Desktop Infrastructure (VDI), distributed storage and distributed processing (e.g., Apache Hadoop), data analytics cluster computing (e.g., Apache Spark), Infrastructure as a Service (IaaS), Platform as a Service (PaaS), and other cloud computing platforms (e.g., Vmware vCloud, Open Stack, and Microsoft Azure). Further, the above described embodiments may be used, in whole or in party, in systems conducting various types of computing, including Scale Out, Disaggregation, Multi-Thread/Distributed Processing, RackScale, Data Center Scale Computing, Elastic Memory Provisioning, Memory as a Service, page migration and caching and Application Offloading/Acceleration and Integration, using various types of storage, such as Non-Volatile Memory Express, Flash, Multi-Tenancy, Internet Small Computer System Interface (iSCSI), Object Storage, Scale Out storage, and using various types of networking, such as 10/40/100 GbE, Software-Defined Networking, Silicon Photonics, Rack TOR Networks, and Low-Latency networking.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples because many other architectures can be implemented to achieve the same functionality.

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the disclosure and its practical applications, to thereby enable others skilled in the art to best utilize the disclosure and various embodiments with various modifications as may be suited to the particular use contemplated.

Embodiments according to the present disclosure are thus described. While the present disclosure has been described in particular embodiments, it should be appreciated that the disclosure should not be construed as limited by such embodiments, but rather construed according to the below claims.

What is claimed:

1. A printed circuit board (PCB) rack unit configuration comprising:
    a first PCB assembly having a first side and a second side, the first side of the first PCB assembly including a first plurality of power module components and the second side of the first PCB assembly including a first plurality of memory interfaces for dual-inline memory modules (DIMMs), the first PCB assembly coupled to a first socket and the first plurality of power module components coupled to the first plurality of memory interfaces; and
    a second PCB assembly having a first side and a second side, the first side of the second PCB assembly including a second plurality of power module components and the second side of the second PCB assembly including a second plurality of memory interfaces for DIMMs, the second PCB assembly coupled to a second socket and the second plurality of power module components coupled to the second plurality of memory interfaces, wherein an orientation of the second PCB assembly is inverted with respect to an orientation of the first PCB assembly while the first side of the first PCB assembly faces the first side of the second PCB assembly such that the first plurality of power module components of the first PCB assembly and the second plurality of power module components of the second PCB assembly face each other in a nested orientation with mechanical clearance.

2. The PCB rack unit configuration of claim 1, wherein the first PCB assembly is decouplable from the first socket without decoupling the second PCB assembly from the second socket.

3. The PCB rack unit configuration of claim 1, wherein a circuit layout of the first PCB assembly is identical to a circuit layout of the second PCB assembly.

4. The PCB rack unit configuration of claim 1, wherein an orientation of the second socket is inverted with respect to an orientation of the first socket.

5. The PCB rack unit configuration of claim 1, wherein the first PCB assembly comprises a first controller on the first side of the first PCB assembly and wherein the second PCB assembly comprises a second controller on the first side of the second PCB assembly, and wherein further the first controller and the second controller have mechanical clearance suitable to allow coupling of the first PCB assembly to the first socket.

6. The PCB rack unit configuration of claim 1, wherein the first PCB assembly comprises a first heatsink on the first side of the first PCB assembly and wherein the second PCB assembly comprises a second heatsink on the first side of the second PCB assembly, and wherein further the first heatsink and the second heatsink have mechanical clearance suitable to allow coupling of the first PCB assembly to the first socket.

7. The PCB rack unit configuration of claim 1, wherein the plurality of memory interfaces for DIMMs of the first PCB assembly is located on the second side of the first PCB assembly and the plurality of memory interfaces for DIMMs of the second PCB assembly is located on the second side of the second PCB assembly.

8. The PCB rack unit configuration of claim 1, wherein the first side of the first PCB assembly comprises a memory buffer and the first side of the second PCB assembly comprises a memory buffer.

9. A system comprising:
    a first circuit board having a first side comprising a first plurality of memory interfaces and a second side comprising a first plurality of power module components, and wherein the first circuit board is coupled to a first socket and the first plurality of power module components coupled to the first plurality of memory interfaces; and
    a second circuit board having a first side comprising a second plurality of memory interfaces and a second side comprising a second plurality of power module components, the second circuit board coupled to a second socket and the second plurality of power module components coupled to the second plurality of memory interfaces, wherein the second circuit board is configured to be inverted with respect to the first circuit board while a portion of the second side of the first circuit board is adjacent to the second side of the second circuit board such that the first plurality of power module components and the second plurality of power module components face each other in a nested orientation with mechanical clearance sufficient to allow coupling of the first circuit board to the first socket.

10. The system of claim 9, wherein the first circuit board and the second circuit board are in a vertical orientation with respect to a bottom of the system.

11. The system of claim 9, wherein the first side of the first circuit board includes a memory controller comprising a field-programmable gate array (FPGA), a processor, or an application-specific integrated circuit (ASIC).

12. The system of claim 9, wherein the second side of the first circuit board comprises an interface selected from the group consisting of a small outline dual in-line memory module (SODIMM), a register DJMM (RDJMM), a load reduced DIMM (LRDIMM), and an unregistered (UDIMM).

13. The system of claim 9, wherein a portion of the first circuit board and a portion of the second circuit board occupy a plane parallel to the first circuit board and the second circuit board.

14. The system of claim 9, wherein a component of the first circuit board is nested with a component of the second circuit board.

15. The system of claim 9, wherein the first plurality of power module components and the second plurality of power module components are thermally decoupled.

16. A system comprising:
a first plurality of memory slots disposed on a first side of a first circuit board;
a first plurality of power module components disposed on a second side of the first circuit board and coupled to the first plurality of memory slots;
a second plurality of memory slots disposed on a first side of a second circuit board;
a second plurality of power module components disposed on a second side of the second circuit board and coupled to the second plurality of memory slots; and
wherein a circuit layout of the second circuit board is identical to a circuit layout of the first circuit board and the second circuit board is inverted with respect to the first circuit board such that a combined height of a nested orientation of the first circuit board and the second circuit board in an inverted orientation with respect to the first circuit board is less than the combined height of a non-nested orientation of the first circuit board and the second circuit board.

17. The system of claim 16, wherein the second side of the first circuit board comprises a second plurality of memory slots.

18. The system of claim 17, wherein the second plurality of memory slots comprises a low profile (LP) dual in-line memory module (DIMM) slot.

19. The system of claim 17, wherein the second plurality of memory slots comprise a very low profile (VLP) DIMM slot.

20. The system of claim 16, wherein the first circuit board and the second circuit board have mechanical clearance sufficient to allow coupling of the first circuit board to the system and the first circuit board is configured to be hot pluggable with the system.

* * * * *